United States Patent
Lee

(10) Patent No.: US 11,180,679 B1
(45) Date of Patent: Nov. 23, 2021

(54) COMPOSITION FOR SEMICONDUCTOR PROCESSING AND METHOD FOR POLISHING SUBSTRATE USING THE SAME

(71) Applicant: SKC SOLMICS CO., LTD., Pyeongtaek-si (KR)

(72) Inventor: Hyeongju Lee, Yongin-si (KR)

(73) Assignee: SKC SOLMICS CO., LTD., Pyeongtaek-si (KR)

( * ) Notice: Subject to any disclaimer, the term of this patent is extended or adjusted under 35 U.S.C. 154(b) by 0 days.

(21) Appl. No.: 16/884,420

(22) Filed: May 27, 2020

(51) Int. Cl.
*C09G 1/02* (2006.01)
*H01L 21/306* (2006.01)
*B24B 7/22* (2006.01)

(52) U.S. Cl.
CPC .............. *C09G 1/02* (2013.01); *B24B 7/228* (2013.01); *H01L 21/30625* (2013.01)

(58) Field of Classification Search
CPC ...... C09G 1/02; B24B 7/228; H01L 21/30625
See application file for complete search history.

(56) References Cited

U.S. PATENT DOCUMENTS

| 7,485,241 B2 * | 2/2009 | Schroeder | C09K 3/1463 252/79.1 |
|---|---|---|---|
| 2019/0077994 A1 * | 3/2019 | Park | H01L 21/304 |
| 2020/0303198 A1 * | 9/2020 | Kadohashi | C09G 1/02 |
| 2021/0084901 A1 * | 3/2021 | Knopf | A01N 33/04 |

FOREIGN PATENT DOCUMENTS

| JP | 2011-108811 A | 6/2011 |
|---|---|---|
| JP | 2016-124977 A | 7/2016 |
| KR | 10-2007-0105301 A | 10/2007 |
| KR | 10-2018-0099570 A | 9/2018 |
| KR | 10-2018-0120568 A | 11/2018 |
| WO | WO 2017/200297 A1 | 11/2017 |

OTHER PUBLICATIONS

RapidTables, "Logarithm of Zero" via https://www.rapidtables.com/math/algebra/logarithm/Logarithrn_of_0.html ; p. 1 (Year: 2021 ).*
Chemical Book, "2-Butyl-1,2-benzisothiazolin-3-one" via https://www.chemicalbook.com/ChemicalProductProperty_EN_CB8854900.htm ; pp. 1-2 (Year: 2017).*

* cited by examiner

*Primary Examiner* — Binh X Tran
(74) *Attorney, Agent, or Firm* — NSIP Law

(57) ABSTRACT

A composition for semiconductor processing comprises: polishing particles; a thiazolinone compound; and a solvent, wherein a logarithmic reduction factor of a microorganism in the composition, as calculated by Formula 1, is at least 4:

$$\text{Logarithmic reduction factor} = \log(CFU_0/CFU_X) \quad \text{Formula 1}$$

where $CFU_0$ is an initial concentration (CFU/mL) of the microorganism, $CFU_X$ is a concentration (CFU/mL) of the microorganism remaining after standing at room temperature for X days, and X is 1, 2, 3, 4, 5 or 6.

13 Claims, 1 Drawing Sheet

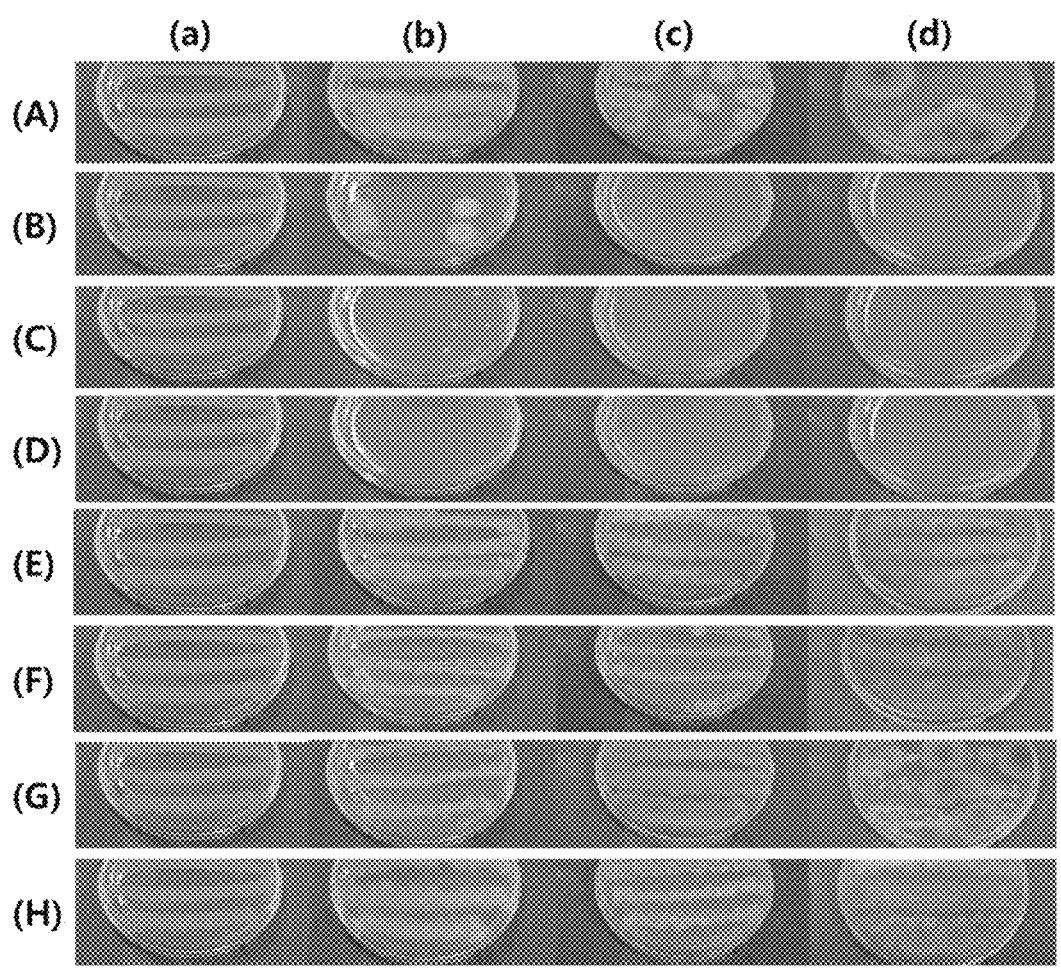

COMPOSITION FOR SEMICONDUCTOR PROCESSING AND METHOD FOR POLISHING SUBSTRATE USING THE SAME

BACKGROUND

1. Field

The present disclosure relates to a composition for semiconductor manufacturing and processing and a method for polishing a substrate using the same. Particularly, present disclosure relates to a composition that is applicable to manufacturing and processing of semiconductor where sophisticated processes are required in very clean environments, and a method for polishing a substrate using the composition to reduce a number of defects on the substrate.

2. Description of Conventional Art

With the recent trend toward semiconductor devices with large-area, highly integrated, and high-density, sophisticated patterning techniques have been required. Since the surface structures of semiconductor devices are becoming more and more complicated, it is very important to prevent formation of surface scratches or adsorption of impurities (that is, formation of so-called defects) during processing by polishing, patterning, and other techniques. Such defects may be caused by several factors. For example, impurities may cause physical scratches. As another example, microorganisms may be physically adsorbed or cause chemical scratches. The current level required for defect prevention in the field of current semiconductor technology is extremely high. There has been much research aimed at decreasing the number of defects on wafer surfaces to substantially 0 (zero). However, this defect level is very difficult to practically achieve. Studies are currently underway in various aspects to achieve the zero-defect level.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a composition for use in semiconductor processing includes polishing particles, a thiazolinone compound, and a solvent wherein a logarithmic reduction factor of a microorganism in the composition, as calculated by Formula 1, is at least 4:

$$\text{Logarithmic reduction factor} = \log(CFU_0/CFU_X) \quad (1)$$

where $CFU_0$ is an initial concentration (CFU/mL) of the microorganism, $CFU_X$ is a concentration (CFU/mL) of the microorganism remaining after standing at room temperature for X days, and X is 1, 2, 3, 4, 5 or 6.

In another general aspect, a method for polishing a substrate includes polishing the substrate using the composition.

BRIEF DESCRIPTION OF THE DRAWINGS

Example embodiments may be more clearly understood from the following detailed description in conjunction with the accompanying drawings in which:

(A) to (H) of FIG. 1 show images showing the degrees of growth of microorganisms in the compositions prepared in Examples 1-4 and Comparative Examples 1-4.

DETAILED DESCRIPTION OF EXAMPLE EMBODIMENTS

The advantages and features of example embodiments and methods for achieving them will become more apparent from the following embodiments that are described in detail below. However, example embodiments are not limited to exemplary embodiments set forth herein and may be embodied in various different forms. Rather, the disclosed exemplary embodiments are provided so that the disclosure of example embodiments will be thorough and complete, and will fully convey the scope of example embodiments to those skilled in the art to which example embodiments pertain. The scope of example embodiments is defined by the claims that follow.

Throughout the specification, the terms "comprises", "comprising," "includes," and "including" will be understood to imply the inclusion of a stated step or element or group of steps or elements but not the exclusion of any other step or element or group of steps or elements, unless otherwise specified.

Throughout the specification, "ppm" means weight/weight (w/w).

Throughout the specification, the term "day" means a period of about twenty-four (24) hours.

One or more examples of a composition that can be used to significantly reduce number of defects during semiconductor processing due to its ability to effectively prevent an environment where microorganisms can grow are described herein. Further, one or more examples of a method for polishing a substrate using the composition are described herein.

A composition for use in semiconductor processing (hereinafter also referred to simply as "composition") according to the present disclosure includes polishing particles, a thiazolinone compound, and a solvent wherein the logarithmic reduction factor of a microorganism in the composition, as calculated by Formula 1, is at least 4:

$$\text{Logarithmic reduction factor} = \log(CFU_0/CFU_X) \quad (1)$$

where $CFU_0$ is an initial concentration (CFU/mL) of the microorganism and $CFU_X$ is a concentration (CFU/mL) of the microorganism remaining after standing at room temperature for X days, and X is 1, 2, 3, 4, 5 or 6.

The composition may be a liquid composition.

Throughout the specification, "CFU" refers to a colony forming unit. Since a viable microorganism in a sample forms colonies during growth, the number of the colonies can be considered as an index representing the number of the viable microorganism in the sample. The number of the microorganism determined from its colony forming units may be different from that observed by microscopy. This is because the number of the microorganism observed by microscopy includes the number of the viable microorganism and the number of the dead microorganism, that is, it corresponds to the total number of the microorganism irrespective of whether they are alive or dead. In contrast, the number of the microorganism determined from its colony forming units corresponds to the number of the viable microorganism.

The number of colony forming units per milliliter (CFU/mL) is calculated by dividing the number of the colonies of grown microorganism by a dilution factor and subsequently dividing this by the volume plated (mL), as given by Equation 1:

$$\text{Colony forming unit (CFU/mL)} = \text{Number of colonies} \times 1/\text{dilution factor} \times 1/\text{volume plated (mL)} \quad (1)$$

According to one embodiment, the logarithmic reduction factor of the microorganism in the composition is ≥4, as calculated by Formula 1. The logarithmic reduction factor may be, for example, from 4 to 15, for example, from 4 to 12, for example, from 4 to 10 or, for example, from 4 to 9. An increase in the logarithmic reduction factor of the microorganism indicates a smaller amount of the microorganism remained after the lapse of a predetermined time than the amount of the microorganism added.

According to one embodiment, the $\log(\text{CFU}_0/\text{CFU}_4)$ value may be equal to or greater than the $\log(\text{CFU}_0/\text{CFU}_1)$ value and the $\log(\text{CFU}_0/\text{CFU}_6)$ value may be equal to or greater than the $\log(\text{CFU}_0/\text{CFU}_4)$ value. This tendency of the logarithmic reduction factor demonstrates significantly improved long-term stability of the composition.

The logarithmic reduction factor of the microorganism in the composition may be determined overall, for example, by the kinds, contents, and the way of mixing the components of the composition.

The microorganism may be *E. coli, C. albicans, A. brasiliensis* or a mixture of thereof.

*E. coli* is an abbreviation for *Escherichia coli* and is indicative of the bactericidal activity of the composition.

*C. albicans* is an abbreviation for *Candida albicans* belonging to the Fungi Imperfecti. *C. albicans* is indicative of the fungicidal activity of the composition against yeasts.

*A. brasiliensis*, an abbreviation for *Agaricus brasiliensis*, is a fungal species. *A. brasiliensis* is indicative of the fungicidal activity of the composition.

These microorganisms may be used alone or as a mixture thereof to evaluate the logarithmic reduction factor. At this time, the microorganisms are allowed to grow in a medium until a certain number of colonies is reached. Any general suitable medium for culturing the microorganisms may be used without limitation.

The polishing particles serve to polish or clean semiconductor surfaces. Specifically, the polishing particles can be selected from the group consisting of silicon oxide particles, cerium oxide (ceria) particles, titanium oxide particles, zirconium oxide particles, inorganic composite particles, organic and inorganic composite particles, and combinations thereof.

The inorganic composite particles may be particles of a mixture of at least two of the above-described polishing particles. For example, the inorganic composite particles may be silicon-cerium oxide particles, but are not limited thereto.

The organic and inorganic composite particles may be core-shell particles consisting of a core including a polymer resin and a shell including an inorganic component disposed on the core surface. For example, the polymer resin of the core may include a polyalkyl(meth)acrylate or polystyrene resin and the inorganic component of the shell may include silicon oxide or cerium oxide (ceria).

The polishing particles may be present in an amount ranging from about 1.5% by weight to about 20% by weight, for example, from about 5% by weight to about 16% by weight, for example, from about 9% by weight to about 15% by weight, for example, from about 10% by weight to about 13.5% by weight, based on the total weight of the composition. Within this range, the polishing particles can be uniformly dispersed in the composition and the composition can be used in semiconductor processing to flatten semiconductor surfaces without deteriorating the reliability of wiring layers formed on the surfaces.

The particle diameter at 10% of the cumulative mass particle size distribution (D10) of the polishing particles may be from about 40 nm to about 70 nm and the particle diameter at 90% of the cumulative mass particle size distribution (D90) of the polishing particles may be from about 100 nm to about 130 nm. Specifically, D10 of the polishing particles may be from about 50 nm to about 60 nm and D90 of the polishing particles may be from about 110 nm to about 120 nm.

The particle diameter at 50% of the cumulative mass particle size distribution (D50) of the polishing particles may be from about 70 nm to about 100 nm, for example, from about 80 nm to about 90 nm.

The ratio D90/D50 of the polishing particles may be from about 1.2 to about 1.5, the ratio D90/D10 of the polishing particles may be from about 1.8 to about 2.4, and the ratio D50/D10 of the polishing particles may be from about 1.3 to about 1.8.

The use of the polishing particles meeting the requirements for the particle size distribution improves the ability of the composition to prevent the formation of defects and is advantageous in inhibiting the growth of the microorganism.

The content of the thiazolinone compound in the composition may be from more than about 100 ppm (0.01% by weight) to about 1200 ppm (0.12% by weight), for example, from 150 ppm (0.015% by weight) to about 1150 ppm (0.115% by weight), for example, from about 200 ppm (0.02% by weight) to about 1000 ppm (0.1% by weight), for example, from about 500 ppm (0.05% by weight) to about 1000 ppm (0.1% by weight). Within the range defined above, the logarithmic reduction factor of the microorganism in the composition can be advantageously adjusted to the range (4) defined above.

Specific examples of such thiazolinone compounds include, but are not particularly limited to, thiazolinone and derivatives thereof. The thiazolinone compound is selected from the group consisting of methylisothiazolinone (MIT), chloromethylisothiazolinone (CMIT), benzisothiazolinone (BIT), octylisothiazolinone (OIT), dichlorooctylisothiazolinone (DCOIT), butylbenzisothiazolinone (BBIT), and combinations thereof. For example, the thiazolinone compound may be benzisothiazolinone. The use of the thiazolinone compound is advantageous in achieving the desired logarithmic reduction factor of the microorganism.

The thiazolinone compound included in the composition may have a reduction rate of the compound of 2%, as calculated by Formula 2:

$$\text{Reduction rate of the compound (\%)} = (D1-D2)/D1 \times 100 \quad (2)$$

where D1 is the content of the thiazolinone compound measured at room temperature and D2 is the content of the thiazolinone compound measured after storage at 65° C. for 1 day.

Specifically, the reduction rate of the thiazolinone compound included in the composition may not be greater than 1.9%, for example, not greater than 1.5%, as calculated by Formula 2.

When the reduction rate of the thiazolinone compound is not greater than the upper limit defined above, the thiazolinone compound is highly compatible with the composition;

that is, it interacts with the other components of the composition, thus being advantageous in inhibiting the growth of the microorganism.

The thiazolinone compound may be included in an ionized or non-ionized form in the composition. Accordingly, the total content of the thiazolinone compound detected in the ionized or non-ionized form is considered as the content of the thiazolinone compound described above.

When the composition is a liquid composition, the solvent serves as a medium to disperse the polishing particles and to dissolve the other components. Examples of such solvents include water-soluble solvents such as distilled water and fat-soluble solvents such as paraffin.

The content of the solvent in the liquid composition may be 79.88% by weight or more, for example, from about 79.88% by weight to about 98.4% by weight, for example, from about 83.9% by weight to about 94.9% by weight, for example, about 84.9% by weight to about 91% by weight, for example, about 86.4% by weight to about 89.9% by weight, based on the total weight of the liquid composition.

The composition may further include a compound selected from the group consisting of a zwitterionic compound, a water-soluble polymer, an organic acid, an azole compound, a glycol compound, and combinations thereof.

The zwitterionic compound can be selected from the group consisting of, but not limited to, iminodiacetic acid (IDA), nitrilotriacetic acid, N-oxalylglycine, acetylcysteine, and combinations thereof. Iminodiacetic acid is preferred.

The composition may further include 0.1 to 5 parts by weight, for example, 0.1 to 3 parts by weight, for example, 0.1 to 2 parts by weight of the zwitterionic compound, based on 100 parts by weight of the polishing particles.

The water-soluble polymer can be selected from the group consisting of, but not limited to, polyvinylpyrrolidone, polyvinyl alcohol, polyethylene glycol, polymethacrylic acid, and combinations thereof. Polyvinylpyrrolidone is preferred.

The water-soluble polymer may have a weight average molecular weight (Mw) of 2,500 to 100,000 daltons, for example, 3,000 to 50,000 daltons. The weight average molecular weight of the water-soluble polymer is suitably in the range of 3,500 to 10,000 daltons.

The composition may further include 1 to 50 parts by weight, for example, 1 to 30 parts by weight of the water-soluble polymer, based on 100 parts by weight of the polishing particles.

The organic acid can be selected from the group consisting of acetic acid, phosphonic acid, formic acid, benzoic acid, nicotinic acid, picolinic acid, alanine, glutamic acid, phthalic acid, and combinations thereof. According to one exemplary embodiment, the composition may include acetic acid or phosphonic acid.

The composition may further include 1 to 50 parts by weight of the organic acid, for example, 1 to 40 parts by weight of the organic acid, based on 100 parts by weight of the polishing particles.

The azole compound can be selected from the group consisting of benzotriazole (BTA), 5-methyl-1H-benzotriazole, 3-amino-1,2,4-triazole, 5-phenyl-1H-tetrazole, 3-amino-5-methyl-4H-1,2,4-triazole, 5-aminotetrazole (ATA), 1,2,4-triazole, tolyltriazole, and combinations thereof. According to one embodiment, the composition may include benzotriazole as the azole compound.

The glycol compound can be selected from the group consisting of polyethylene glycol, polypropylene glycol, and combinations thereof. According to one embodiment, the composition may include polyethylene glycol as the glycol compound.

The composition may further include a polishing modifier, a pH adjusting agent, and a surfactant.

Examples of suitable polishing modifiers include, but are not limited to, ammonium compounds, potassium nitrate, amino acids, and salts of amino acids, which serve to minimize the adsorption of the polishing particles to wafer surfaces during semiconductor processing, particularly polishing, achieving improved selectivity for the polishing.

The composition may include about 5 to about 10 parts by weight, for example, about 5 to 9 parts by weight, for example, about 7 to about 9 parts by weight of the polishing modifier, based on 100 parts by weight of the polishing particles.

The pH adjusting agent can be selected from the group consisting of, but not limited to, ammonium hydroxide ($NH_4OH$), potassium hydroxide (KOH), sodium hydroxide (NaOH), tetramethylammonium hydroxide (TMAH), tetramethylamine (TMA), and combinations thereof.

The surfactant serves to better disperse the polishing particles in the composition. Examples of such surfactants include citric acid (CA), polyacrylic acid (PAA), and acrylamide-acrylic acid copolymers.

When all or some of the components described above are included in the composition and the logarithmic reduction factor of the microorganism in the composition is at least 4, as calculated by Formula 1, the composition can achieve the desired effects when used in semiconductor manufacturing and processing techniques, where clean environments and sophisticated processes are required. In addition, when the reduction rate of the thiazolinone compound included in the composition is controlled within the above range, as calculated by Formula 2, the above-described effects can be advantageously obtained.

A method for polishing a substrate according to the present disclosure uses the composition for use in semiconductor processing described above.

Any substrate that needs to be polished in semiconductor processes may be used without limitation in example embodiments. Specifically, the substrate may be a copper, tantalum, silicon or glass substrate on which an oxide film or electrically conductive film is optionally formed. The electrically conductive film may be formed along a predetermined wiring pattern on the surface of the substrate.

The method for polishing a substrate includes: preparing a retaining plate holding the substrate to be polished, a polishing head supporting the retaining plate, and a polishing table where a polishing pad is located; feeding the composition onto the polishing pad; and polishing a surface of the substrate while pressing the surface against the polishing pad at a predetermined pressure.

The polishing may be performed by moving the polishing pad relative to the substrate at a predetermined speed in a predetermined direction.

The use of the composition leads to the formation of few or substantially no defects. Particularly, the use of the composition can reduce the number of defects on the polished substrate that are caused by contamination of the composition or the polishing pad with microorganisms present in the composition. Specifically, the number of defects on the polished substrate can be reduced to 10 or less, 5 or less, or 0 to 5.

Example embodiments will be explained in more detail with reference to the following examples. However, these examples are provided for illustrative purposes only and should not be construed to limit example embodiments. In the examples, ppm is by weight.

EXAMPLES AND COMPARATIVE EXAMPLES

Example 1

A liquid composition for use in semiconductor processing including 3 wt % of silicon oxide particles, 0.5 wt % of acetic acid, 0.5 wt % of phosphonic acid, 500 ppm of benzisothiazolinone (BIT), 0.5 wt % of polyethylene glycol, and the remaining balance of distilled water was prepared.

Example 2

A liquid composition for use in semiconductor processing was prepared in the same manner as in Example 1, except that the amount of benzisothiazolinone (BIT) was changed to 1,000 ppm.

Example 3

A liquid composition for use in semiconductor processing including 5 wt % of silicon oxide particles, 0.5 wt % of acetic acid, 500 ppm of benzisothiazolinone, and the remaining balance of distilled water was prepared.

Example 4

A liquid composition for use in semiconductor processing was prepared in the same manner as in Example 3, except that the amount of benzisothiazolinone (BIT) was changed to 1,000 ppm.

Comparative Example 1

A liquid composition for use in semiconductor processing was prepared in the same manner as in Example 1, except that benzisothiazolinone (BIT) was not included.

Comparative Example 2

A liquid composition for use in semiconductor processing was prepared in the same manner as in Example 1, except that the amount of benzisothiazolinone (BIT) was changed to 100 ppm.

Comparative Example 3

A liquid composition for use in semiconductor processing was prepared in the same manner as in Example 3, except that benzisothiazolinone (BIT) was not included.

Comparative Example 4

A liquid composition for use in semiconductor processing was prepared in the same manner as in Example 3, except that the amount of benzisothiazolinone (BIT) was changed to 100 ppm.

<Evaluation>

Experimental Example 1: Evaluation of Compatibility Between the Thiazolinone Compound and the Liquid Compositions The contents of the benzisothiazolinone in each of the liquid compositions of Examples 1-4 and Comparative Examples 1-4 were measured at room temperature and after storage of the liquid composition at 65° C. for 1 day and were defined as D1 and D2, respectively. For compatibility evaluation, the reduction rate of the thiazolinone compound was calculated by Formula 2:

$$\text{Reduction rate (\%)}=(D1-D2)/D1\times 100 \quad (2)$$

The results are described in Table 1.

Experimental Example 2: Evaluation of Ability of the Thiazolinone Compound to Inhibit the Growth of Microorganisms On different days (X) after test microbial strains, including seven bacterial strains including *E. coli*, yeast strain of *C. albicans*, and fungal strain of *A. brasiliensis*, were added at a concentration of $10^6$ CFU/mL ($=CFU_0$) to each of the liquid compositions of Examples 1-4 and Comparative Examples 1-4, CFU ($=CFU_X$) values were measured. The bacterial, yeast, and fungal strains were allowed to grow in a conventional media before use. Subsequently, the logarithmic reduction factors of the microorganisms at X=1, 4, and 6 were calculated by Formula 1:

$$\text{Logarithmic reduction factor}=\log(CFU_0/CFU_X) \quad (1)$$

The results are described in Table 1.

TABLE 1

| | Reduction rate of the thiazolinone compound | Logarithmic reduction factors of the microorganisms | | |
|---|---|---|---|---|
| | [%] | X = 1 | X = 4 | X = 6 |
| Example 1 | 1.9 | 4.0 | 5.1 | 5.9 |
| Example 2 | 1.5 | 5.1 | 5.4 | 8.4 |
| Example 3 | 0.2 | 5.7 | 6.1 | 8.5 |
| Example 4 | 0.1 | 7.4 | 8.4 | 10.2 |
| Comparative Example 1 | — | 3 | 2.8 | 2.1 |
| Comparative Example 2 | 2.0 | 3.9 | 3.5 | 3.1 |
| Comparative Example 3 | — | 3.6 | 3.2 | 2.6 |
| Comparative Example 4 | 0.5 | 3.8 | 3.3 | 2.9 |

In FIG. 1, (A) to (H) show images showing the degrees of growth of the microorganisms in the liquid compositions of Examples 1-4 (FIGS. 1(A) to 1(D)) and Comparative Examples 1-4 (FIGS. 1(E) to 1(H)), respectively. Specifically, in FIG. 1, (a), (b), (c), and (d) are images taken at X=0, 1, 4, and 6, respectively. The results in Table 1 and FIG. 1 reveal better storage stabilities of the liquid compositions of Examples 1-4 than those of Comparative Examples 1-4.

Experimental Example 3: Evaluation of Wafer Polishing Performance of the Liquid Compositions The polishing performance of each of the liquid compositions of Examples 1-4 and Comparative Examples 1-4 was evaluated by the following procedure. First, each of the as-prepared liquid compositions was allowed to stand for at least 6 days. An electroplated copper wafer with a thickness of ~5,000 Å, a tantalum wafer with a thickness of ~2,000 Å, and a silicon oxide wafer with a thickness of ~20,000 Å were polished with a polishing pad while feeding the liquid composition onto the polishing pad. Specifically, the wafers were immersed in 0.01 M nitric acid for 10 min to remove insulating oxide layers from the wafer surfaces, and then were polished before evaluation. The polishing was performed by feeding 0.5 wt % of hydrogen peroxide ($H_2O_2$) together with the liquid composition for 60 sec under the following conditions: pressure 1.55 psi, carrier speed 63 rpm, platen speed 57 rpm, slurry flow rate 300 ml/min.

The number of defects on each wafer after polishing was measured using a defect inspection system (XP+, Tenkor) and the polishing performance of the liquid composition was evaluated based on the following criteria:
  ⊚: 0≤defects≤5
  ○: 5<defects≤10
  Δ: 10<defects≤20
  x: defects>20

TABLE 2

|  | Copper wafer | Tantalum wafer | Silicon oxide film wafer |
|---|---|---|---|
| Example 1 | ○ | ⊚ | ⊚ |
| Example 2 | ⊚ | ⊚ | ⊚ |
| Comparative Example 1 | X | X | X |
| Comparative Example 2 | Δ | Δ | X |

As can be seen from the results in Tables 1 and 2, the number of defects was significantly reduced when each of the liquid compositions of Examples 1 and 2, in which the logarithmic reduction factors of the microorganisms were ≥4, was used for polishing in semiconductor processes. In contrast, the number of defects was significantly more when each of the liquid compositions of Comparative Examples 1 and 2, in which the logarithmic reduction factors of the microorganisms were <4, was used for polishing. When the liquid compositions of Examples 1 and 2 were used, the reduction rates of the thiazolinone compound were <2%, as calculated by Formula 2. In contrast, the liquid compositions of Comparative Examples 1 and 2 failed to meet the requirement of <2% for the reduction rate of the thiazolinone compound. Along with their better compatibility with the thiazolinone compound, the liquid compositions of Examples 1 and 2 significantly inhibited the growth of the microorganisms and achieved improved polishing performance.

The composition of the present disclosure can be used to minimize proliferation of a microorganism. The composition and the method of the present disclosure can minimize the formation of imperfections caused by chemical factors as well as physical factors when used in semiconductor manufacturing and processing, such that the number of defects on semiconductor surfaces can be reduced to a minimal level.

What is claimed is:

1. A composition for semiconductor processing comprising:
  polishing particles;
  a thiazolinone compound;
  a solvent;
  an organic acid; and
  a microorganism,
  wherein a content of the thiazolinone compound is from 100 ppm to 1200 ppm,
  wherein the composition comprises 1 to 50 parts by weight of the organic acid, based on 100 parts by weight of the polishing particles,
  wherein a logarithmic reduction factor of the microorganism in the composition, as calculated by Formula 1, is at least 4, and
  wherein the thiazolinone compound has a reduction rate, as calculated by Formula 2, of 1.9% or less:

Logarithmic reduction factor=log($CFU_0/CFU_X$)    Formula 1 where $CFU_0$ is an initial concentration of the microorganism, $CFU_X$ is a concentration of the microorganism remaining after standing at room temperature for X days, and X is 1, 2, 3, 4, 5 or 6

Reduction rate (%)=($D1-D2$)/$D1$×100    Formula 2 where D1 is a content of the thiazolinone compound measured at room temperature and D2 is a content of the thiazolinone compound measured after storage at 65° C. for 1 day.

2. The composition of claim 1, wherein the composition is a liquid composition.

3. The composition of claim 1, wherein the microorganism comprises at least one of *E. coli, C. albicans* and *A. brasiliensis*.

4. The composition of claim 1, wherein the logarithmic reduction factor where X is 4 is equal to or greater than the logarithmic reduction factor where X is 1.

5. The composition of claim 1, wherein the logarithmic reduction factor where X is 6 is equal to or greater than the logarithmic reduction factor where X is 4.

6. The composition of claim 1, wherein the logarithmic reduction factor is from 4 to 15.

7. The composition of claim 1, wherein the thiazolinone compound is selected from the group consisting of methylisothiazolinone (MIT), chloromethylisothiazolinone (CMIT), benzisothiazolinone (BIT), octylisothiazolinone (OIT), dichlorooctylisothiazolinone (DCOIT), butylbenzisothiazolinone (BBIT), and combinations thereof.

8. The composition of claim 1, wherein the polishing particles are selected from the group consisting of silicon oxide particles, cerium oxide (ceria) particles, titanium oxide particles, zirconium oxide particles, inorganic composite particles, organic and inorganic composite particles, and combinations thereof.

9. The composition of claim 1, wherein a content of the solvent is 79.88% by weight or more based on a total weight of the composition.

10. The composition of claim 1, further comprising a compound selected from the group consisting of a zwitterionic compound, a water-soluble polymer, an azole compound, a glycol compound, and combinations thereof.

11. The composition of claim 1, wherein a particle diameter at 10% of a cumulative mass particle size distribution (D10) of the polishing particles is from 40 nm to 70 nm.

12. The composition of claim 1, wherein a particle diameter at 90% of a cumulative mass particle size distribution (D90) of the polishing particles is from 100 nm to 130 nm.

13. The composition of claim 1, wherein the thiazolinone compound is benzisothiazolinone (BIT).

* * * * *